(12) United States Patent
Parker

(10) Patent No.: US 7,127,010 B1
(45) Date of Patent: Oct. 24, 2006

(54) OSCILLATOR CONTROLLING

(75) Inventor: Robert P. Parker, Westboro, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 09/364,241

(22) Filed: Jul. 29, 1999

(51) Int. Cl.
*H04L 27/06* (2006.01)

(52) U.S. Cl. .................... 375/344; 455/161.1

(58) Field of Classification Search ............... 375/326, 375/327, 339, 342, 373, 362, 376, 226; 331/1 R, 331/2, 10, 11, 16, 18, 34, 36 C, 1 A, 41, 48; 455/161.1, 164.1, 165.1, 169.1, 173.1, 180.1, 455/180.3, 182.2, 183.1, 196.1, 192.1, 192.2, 455/192.3, 195.1
See application file for complete search history.

(56) References Cited

U.S. PATENT DOCUMENTS

| | | | | |
|---|---|---|---|---|
| 3,794,925 A | * | 2/1974 | Imazeki | 455/166.1 |
| 3,883,807 A | * | 5/1975 | Alberkrack | 455/180.3 |
| 4,021,752 A | * | 5/1977 | Sato et al. | 331/17 |
| 4,142,158 A | * | 2/1979 | Belisomi | 455/183.1 |
| 4,163,259 A | * | 7/1979 | Skerlos | 348/731 |
| 4,220,922 A | * | 9/1980 | Ikeguchi | 455/182.1 |
| 4,245,348 A | * | 1/1981 | Imazeki | 455/154.2 |
| 4,270,220 A | * | 5/1981 | Hagiwara et al. | 455/182.1 |
| 4,272,729 A | * | 6/1981 | Riley, Jr. | 331/1 A |
| 4,384,365 A | * | 5/1983 | Malinowski et al. | 331/18 |
| 4,602,225 A | * | 7/1986 | Miller et al. | 331/1 A |
| 4,748,684 A | * | 5/1988 | Wright, Jr. | 455/182.3 |
| 4,959,872 A | * | 9/1990 | Imai et al. | 455/164.1 |
| 5,079,522 A | * | 1/1992 | Owen et al. | 331/1 A |
| 5,125,105 A | * | 6/1992 | Kennedy et al. | 455/164.1 |
| 5,134,720 A | * | 7/1992 | Gamgee et al. | 340/825.72 |
| 5,280,638 A | * | 1/1994 | Porambo et al. | 455/143 |
| 5,307,515 A | * | 4/1994 | Kuo et al. | 455/295 |
| 5,457,816 A | * | 10/1995 | Koyama | 455/161.2 |
| 5,465,410 A | * | 11/1995 | Hiben et al. | 455/182.2 |
| 5,640,126 A | * | 6/1997 | Mellot | 329/325 |
| 5,781,851 A | * | 7/1998 | Saito | 455/182.1 |
| 5,825,833 A | * | 10/1998 | Sakaue | 375/216 |
| 5,850,164 A | * | 12/1998 | Mellot | 329/326 |
| 6,011,818 A | * | 1/2000 | Yang | 375/327 |
| 6,052,419 A | * | 4/2000 | Hioki | 375/344 |
| 6,094,236 A | * | 7/2000 | Abe et al. | 348/731 |
| 6,373,398 B1 | * | 4/2002 | Matsumoto | 340/825.72 |
| 6,438,361 B1 | * | 8/2002 | Chong et al. | 455/188.1 |

FOREIGN PATENT DOCUMENTS

| | | |
|---|---|---|
| DE | 34 43 859 A1 | 6/1985 |
| DE | 42 36 621 A1 | 5/1994 |
| EP | 0 451 342 A2 | 10/1991 |

* cited by examiner

*Primary Examiner*—Khanh Tran
(74) *Attorney, Agent, or Firm*—Fish & Richardson P.C.

(57) ABSTRACT

A receiver local oscillator is always tuned to a frequency that lies within a range of reception frequencies of the receiver. The oscillator is tuned to a frequency less than and above the received frequency when the received frequency is above and below a threshold frequency, respectively.

10 Claims, 6 Drawing Sheets

OSCILLATOR CONTROLLING

This application relates to controlling the frequency of an oscillator, and, more particularly, to controlling the frequency of a local oscillator in a superheterodyne receiver when the receiver is tuned to a particular frequency.

A superheterodyne receiver mixes two different electrical signals, typically having two different frequency values, to produce an electrical signal having an intermediate frequency at the output. The superheterodyne receiver is tuned to receive a particular frequency, a signal in the radio frequency range which constitutes one of the two different electrical signals. The superheterodyne receiver also includes a local oscillator that produces an electrical signal at a predetermined frequency. The receiver mixes the electrical signal from the local oscillator with the received signal to produce an output signal at an intermediate frequency.

For example, for an unlicensed communications device, a superheterodyne receiver can be tuned to receive a signal within a frequency range of, e.g., 2400 MHz–2485 MHz. In turn, the local oscillator can be tuned to a frequency based on an offset from the received signal, e.g., 40 MHz above the frequency of the received signal. Alternatively, the offset frequency of another receiver can be, e.g., 40 MHz below the frequency of the received signal. In either case, when mixed, the intermediate frequency is 40 MHz.

Currently, the Federal Communications Commission (FCC) allows unlicensed communication products to operate within the frequency band noted above, i.e., 2400 MHz–2485 MHz. The FCC also allows unintentional radiation of signals of a certain level in this band. However, any radiation of a signal from the device outside the specified frequency band must be suppressed by 40 db more to avoid interfering with devices operating on other frequency bands. Thus, for example, when a local oscillator of a superheterodyne receiver is tuned 40 MHz above the received signal and the received signal is greater than 2445 Mhz, the local oscillator is tuned to a frequency that lies outside the frequency band, i.e., higher than 2485 MHz. Similarly, when a local oscillator is tuned 40 MHz below the received signal and the received signal is less than 2440 Mhz, the local oscillator again is tuned to a frequency that lies outside the frequency band, i.e., lower than 2400 MHz. When the local oscillator is tuned outside the bounds of the frequency band (or is tuned near the bounds of the frequency band), additional processing may be required to ensure that the local oscillator is sufficiently suppressed.

The invention is a controlling device that tunes a local oscillator of a receiver to a frequency within a frequency range. The frequency range is the range of reception frequencies to which the receiver can be tuned to receive electromagnetic signals.

Through some other means, the frequency which is desired to be received is known. The desired frequency to be received is compared with a threshold frequency. Based on the comparison, the oscillator is tuned: to a frequency less than the received frequency when the received frequency is above the threshold frequency, and tuned to a frequency greater than the received frequency when the received frequency is less than the threshold frequency.

Embodiments of the invention may include the following features.

In a superheterodyne receiver, the range of frequencies is bounded by high and low frequencies $F_{HIGH}$ and $F_{LOW}$ respectively, where $F_{HIGH}$ is 2400 MHz and $F_{LOW}$ is 2485 MHz. A received frequency is converted to an index value based on a number of channels in the range of reception frequencies and based on a channel spacing in the range of reception frequencies. The threshold frequency is also represented as an index based on the same criteria. The threshold frequency approximately equals $F_{LOW}+(F_{HIGH}-F_{LOW})/2$. Frequency offsets, having equal magnitudes, are applied to the received frequency: subtracted when the received frequency is greater than the threshold frequency, and added when the received frequency is less than the threshold frequency. The frequency offsets are less than or equal to $(F_{HIGH}-F_{LOW})/2$, and are equal to an intermediate frequency of the receiver. The frequency determined by adding or subtracting the offset frequency is the frequency to which the local oscillator is tuned.

An aspect of the invention may include the following features.

A phase locked loop controls the oscillator, and a microprocessor contains computer instructions to execute the functions of the controlling device.

Embodiments within the scope of the claims may have one or more of the following advantages.

The local oscillator is tuned to a frequency that lies only within the frequency range. The signal from the local oscillator does not require additional signal processing to suppress the signal at frequencies outside the frequency range. Radiation of the signal from the local oscillator outside the frequency range does not adversely affect other devices operating at frequencies outside the frequency range. Receivers utilizing the controlling device meet FCC regulations regarding radiation of signals outside a frequency band dedicated to unlicensed electronic devices.

Other features, objects and advantages will become apparent from the following detailed description when read in connection with the accompanying drawings in which.

Figure 1:
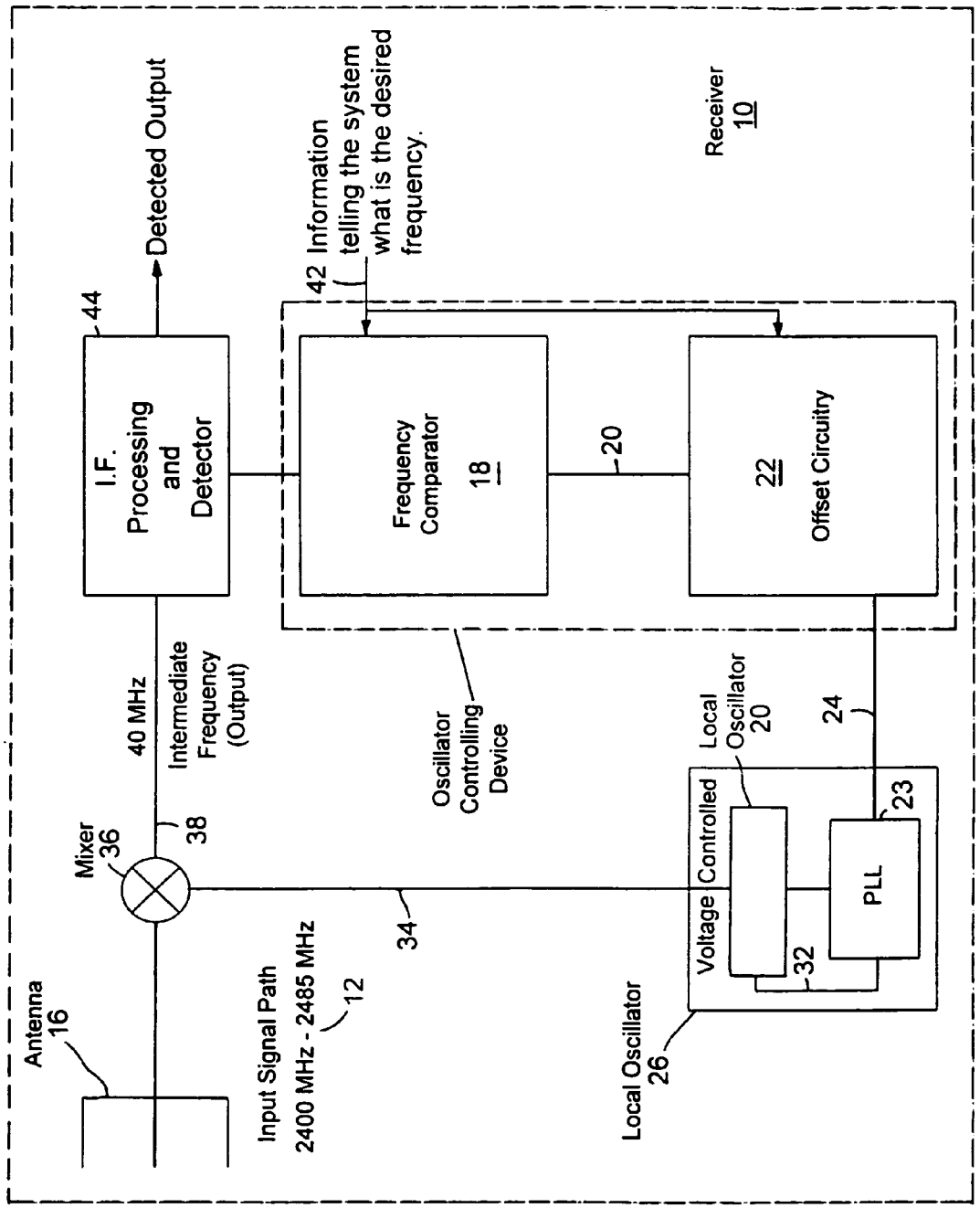
FIG. 1 is a schematic view of a receiver utilizing a local oscillator controlling device according to the invention.

Referring to FIG. 1, a receiver 10 is, e.g., a superheterodyne receiver that may comprise a portion of a controller used to both transmit and receive electromagnetic signals. As an example, receiver 10 can comprise a remote control for use with a music system, a television or cable box. Receiver 10 typically complies with FCC regulations regarding unlicensed transmission and reception devices. Receiver 10 then operates within a predetermined frequency band 12, which is specified as the frequency range bounded at a low end by a frequency, $F_{LOW}$, of 2400 MHz and bounded at a high end by another frequency, $F_{HIGH}$, of 2485 MHz.

Receiver 10 includes a signal path for processing an electromagnetic signal. The signal path includes an antenna 16, and input signal path 14, a mixer 36, an output signal path 38. Receiver 10 receives the electromagnetic signal at antenna 16. Antenna 16 receives an electromagnetic radio signal having a frequency within frequency band 12. Antenna 16 converts the received radio signal into an electrical signal, and input signal path 14 conducts the electrical signal to circuitry of receiver 10, e.g., to mixer 36.

Output signal path 38 further includes IF processing and detector 44. The output signal of mixer 36 is the intermediate frequency of receiver 10, e.g., 40 MHz. IF processing and detector 44 processes the frequency components of the intermediate frequency signal to provide the receiver output.

Receiver 10 includes an oscillator controlling device 40 that is connected to local oscillator 26. An input 42 of device 40 determines what is the desired reception frequency. Controlling device 40 processes the reception frequency signal, and, based on the signal, issues a control signal used to tune the local oscillator 26 to a desired frequency.

Oscillator controlling device 40 of receiver 10 includes a frequency comparator 18, and offset circuitry 22. Frequency comparator 18 is constructed and arranged to compare the desired reception frequency from input 42 to a threshold frequency value. If the desired reception frequency from input 42 is greater than the threshold frequency value, frequency comparator 18 issues an output, e.g., a high voltage signal. If the frequency of the electrical signal is less than the threshold frequency value, frequency comparator 18 issues a different output, e.g., a low voltage signal.

An input/output 20 electrically connects frequency comparator 18 to offset circuitry 22. Offset circuitry 22 issues a control signal at an output 24. The control signal is based on the output signal of frequency comparator 18, and the desired reception frequency input 42 and offset circuitry 22 controls the frequency to which local oscillator 26 is tuned. Local oscillator 26 is tuned to a frequency that is either a positive or negative offset relative to the frequency of the desired reception frequency from antenna 16.

Offset circuitry 22 determines which of two offset values to apply to local oscillator 26. Based on the control signal from offset circuitry 22, receiver 10 tunes local oscillator 26 to a frequency that is less than the reception frequency when frequency comparator 18 determines that the reception frequency is greater than the threshold frequency. On the other hand, based on the control signal, receiver 10 tunes local oscillator 26 to a frequency that is greater than the reception frequency when frequency comparator 18 determines that the reception frequency is less than the threshold frequency.

Comparators generally are well known in the art and many different implementations can be used to practice the invention. Similarly, one skilled in the art can use a variety of mechanisms to implement the functions of offset circuitry 22. For example, a specific implementation of both frequency comparator 18 and offset circuitry 22 is illustrated in FIG. 2B. Frequency comparator 18 and offset circuitry 22 are implemented together using a single microprocessor 60. Microprocessor 60 contains a computer readable medium that contains preprogrammed instructions corresponding to the functions of both frequency comparator 18 and offset circuitry 22. Microprocessor 60 executes the instructions to issue a control signal that receiver 10 uses to tune local oscillator 26 to a desired frequency.

Local oscillator 26 includes a phase-locked loop (PLL) 28 that determines the frequency of oscillator circuitry 30. The output of oscillator circuitry 30 is fed back to PLL 28 along a feedback loop 32. Thus, local oscillator 26 includes a mechanism to maintain the desired frequency to which local oscillator 26 has been tuned. In receiver 10, PLL 28 is implemented by a combination of analog and digital circuitry.

The output of local oscillator 26 becomes an input 34 to mixer 36. Mixer 36 has two inputs, oscillator input 34 and input signal path 14. Mixer 36 mixes both inputs from signal paths 14 and 34 to produce the intermediate frequency signal at output signal path 38.

Figure 2A:
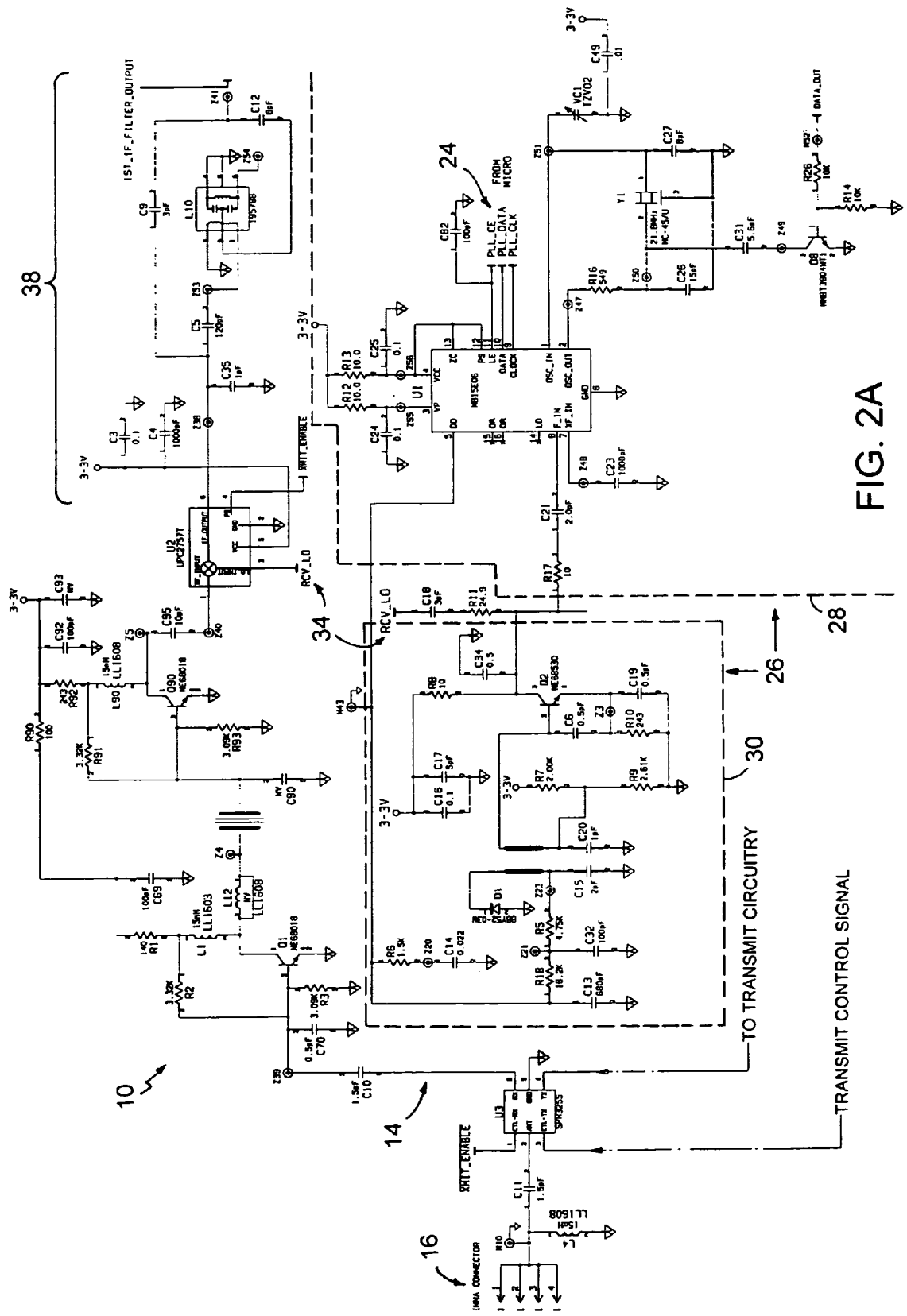
FIG. 2A is a schematic view of a first portion of an electronic circuit of the controlling device of FIG. 1.
Figure 2B:
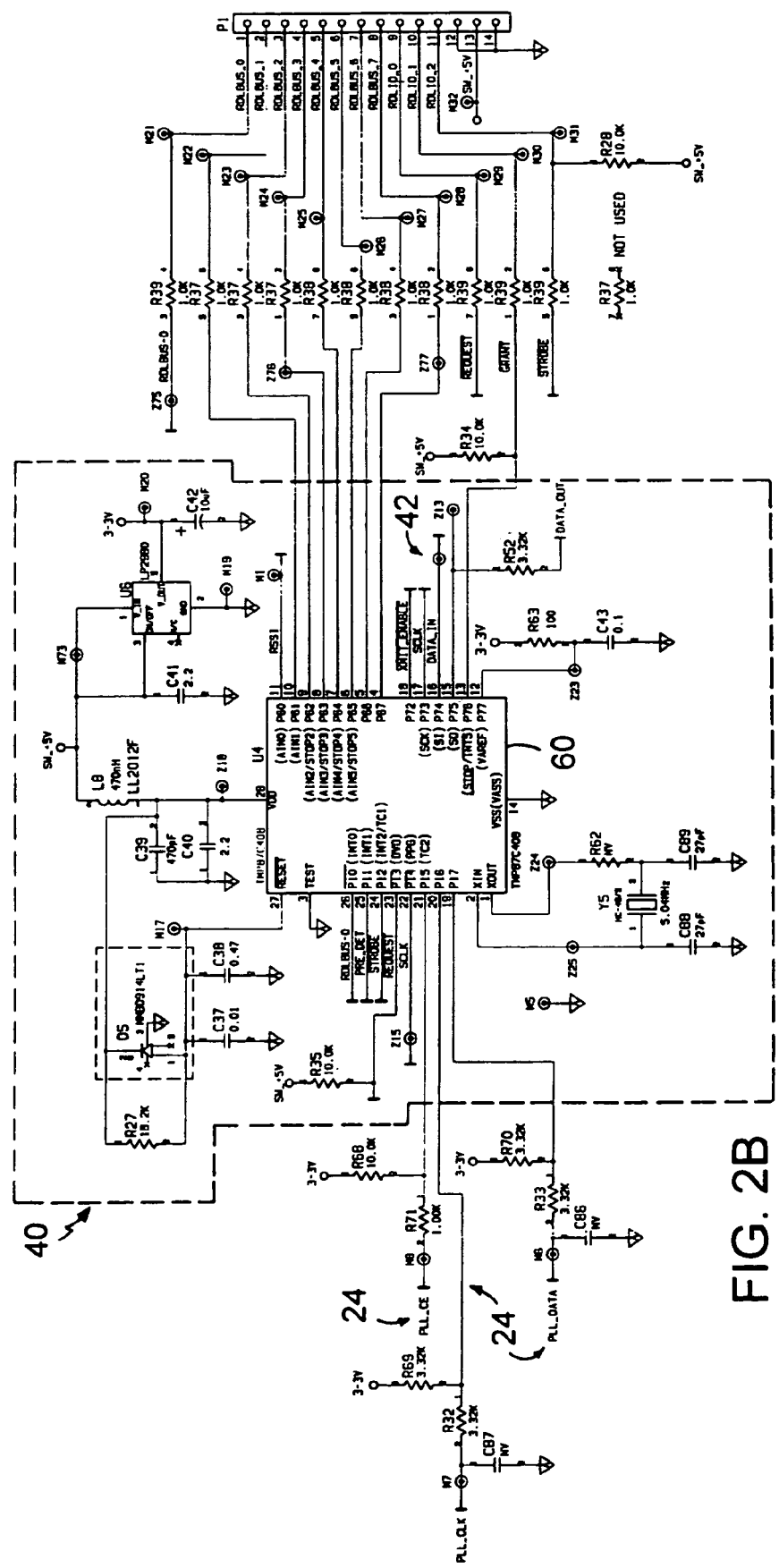
FIG. 2B is a schematic view of a second portion of an electronic circuit of the controlling device of FIG. 1.
Figure 2C:
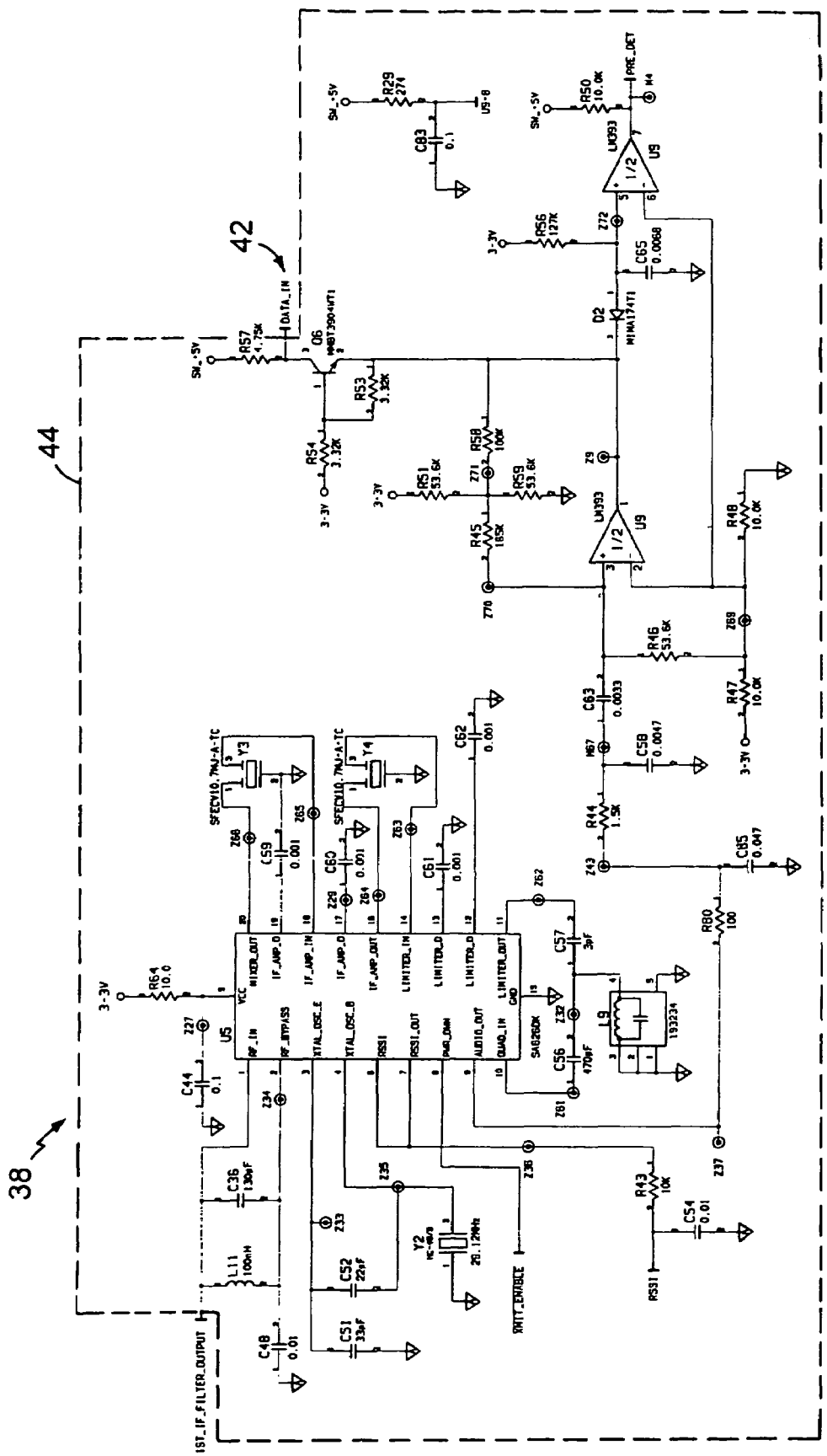
FIG. 2C is a schematic view of a third portion of an electronic circuit of the controlling device of FIG. 1.

Referring to FIGS. 2A–2C, a specific implementation for receiver 10 is shown with sections of the circuitry correlated to the components discussed in relation to FIG. 1. In FIG. 2A, input signal path 14 extends from antenna 16 to mixer 36. Local oscillator 26, which includes PLL 28 and oscillator circuitry 30, connects to mixer 36 via signal path 34, i.e., the local oscillator receive signal, RCV_LO. In FIG. 2B, PLL 28 (FIG. 2A) connects to local oscillator controlling device 40 via digital control signals issued along input/output 24, e.g., PLL_CE, PLL_DATA and PLL_CLK (shown in FIGS. 2A and 2B).

In addition to the implementation shown in FIGS. 2A–2C, many other implementations are possible for receivers within the scope of the claims. For example, output signal path 38 can include a variety of combinations of electrical components not shown in FIGS. 1 and 2A–2C. In addition, receiver 10 incorporates the separate functions of frequency comparator 18 and offset circuitry 22 into single microprocessor 60. One skilled in the art may provide a wide variety of alternate implementations for the components of receiver 10.

Figure 3:
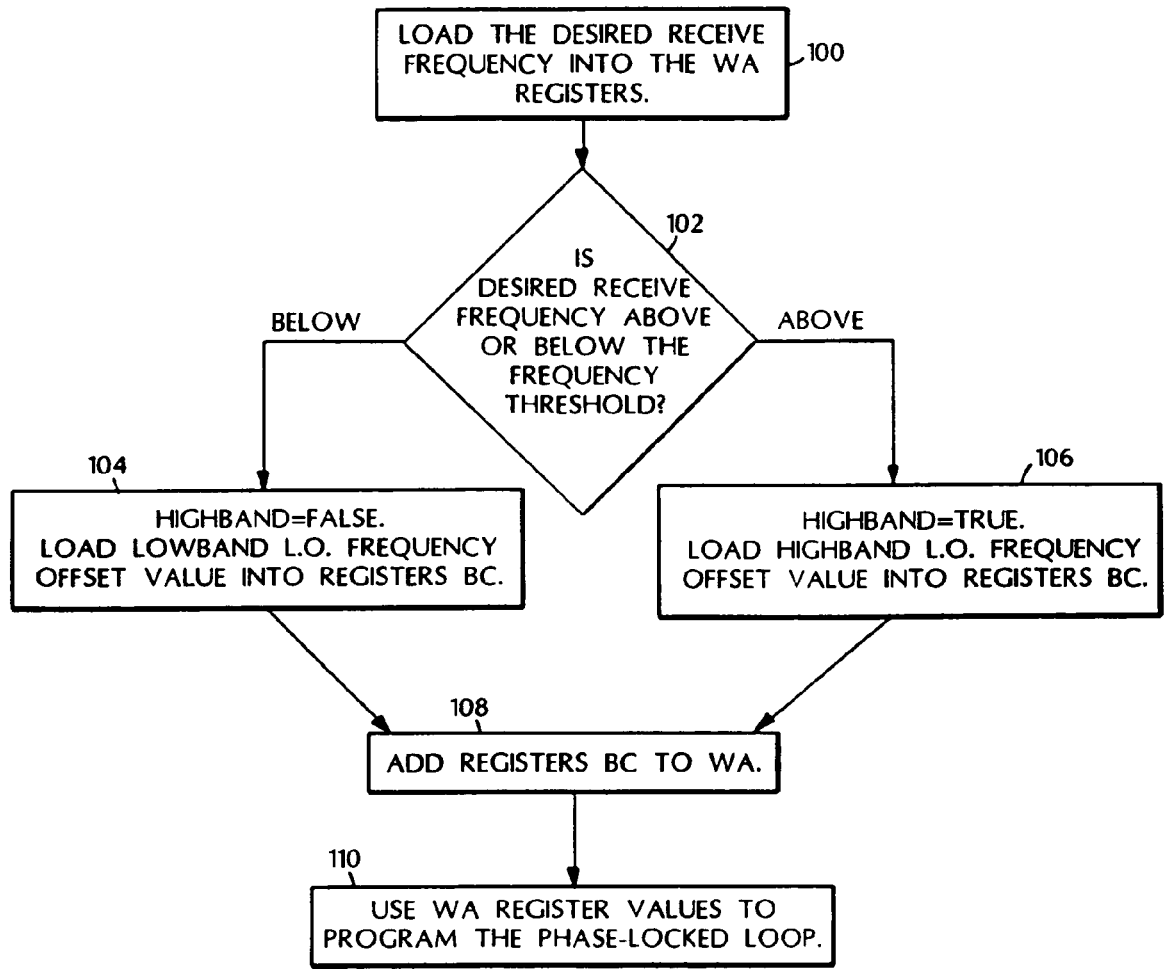
FIG. 3 is a block diagram of logic executed by the controlling device of FIG. 1.

Referring to FIG. 3, receiver 10 utilizes a set of computer instructions to tune local oscillator 26. The computer instructions are contained on a computer readable medium within microprocessor 60 (FIG. 2B). The computer instructions perform the functions of both frequency comparator 18 and offset circuitry 22.

For example, receiver 10 loads a digital value representing the reception frequency (i.e., the frequency of the received signal) into registers of microprocessor 60, e.g. registers WA. (Step 100) Based on the value in registers WA, receiver 10 determines whether the frequency is above or below a value representing the threshold frequency of frequency comparator 18. (Step 102) In receiver 10, the threshold frequency is the center of frequency band 12. For example, frequency band 12 is bounded by high and low frequencies $F_{HIGH}$ and $F_{LOW}$ respectively, and the threshold frequency equals $F_{LOW}+(F_{HIGH}-F_{LOW})/2$, i.e., 2442.5 MHz.

If the value in registers WA is below the threshold value, receiver 10 sets a value indicating that the reception frequency is not in the high band, i.e, 2442.5 MHz to 2485 MHz. (Step 104) If the value in registers WA is above the threshold value, receiver 10 sets a value indicating that the reception frequency is within the high band. (Step 106) After the high band status is determined to be true (step 104) or false (step 106). receiver 10 loads the appropriate offset value into a second set of registers, e.g., registers BC. (Steps 104, 106) The offset value is a digital representation of the offset frequency that receiver 10 applies to local oscillator 26.

In receiver 10, the offset value is one of two values, 40 MHz or −40 MHz. When receiver 10 loads the appropriate offset value, receiver 10 adds the offset value of registers BC to the reception frequency value of registers WA. (Step 108). Finally, receiver 10 uses the resulting value, which is stored in registers WA, to program phased locked loop 28. (Step 110)

As an example, the computer instructions of microprocessor 60 are implemented according to the following Pseudo-C subroutine:

```
Void SetReceiveFrequency ( )
WA=BandFrequencyIndex;
If (WA<=RF_Band_Center)
Highband=False;
P7.Data_Out=False;
BC=Base_LowBand_Rcv_Offset;
else
```

Highband=True;
P7.Data_Out=True;
BC=Base_HighBand_Rcv_Offset;
WA=(WA<<1); /*(index)×(channel spacing)*/
WA=WA+BC;
WritePLLFrequency(WA);
Return;

In the implementation above, an index of frequencies is used to represent the reception frequency. For example, frequency band 12 is a continuous band, but receiver 10 subdivides frequency band 12 into a discrete number of channels that are each separated by 200 kHz. Thus, to calculate a digital value for the reception frequency, receiver 10 sequentially associates each channel with a discrete value in the index of frequencies. To convert the index value to a digital representation of the actual frequency prior to programming PLL 28, receiver 10 multiplies the index value by the channel spacing, e.g., 200 kHz.

When a discrete index value is used, the threshold frequency value may need to be approximated. For example, if the desired threshold frequency is the band center, but the band center does exactly coincide with the frequency of a channel (e.g., falls between two index values), the threshold frequency value can be a value corresponding to an adjacent channel.

Figure 4:
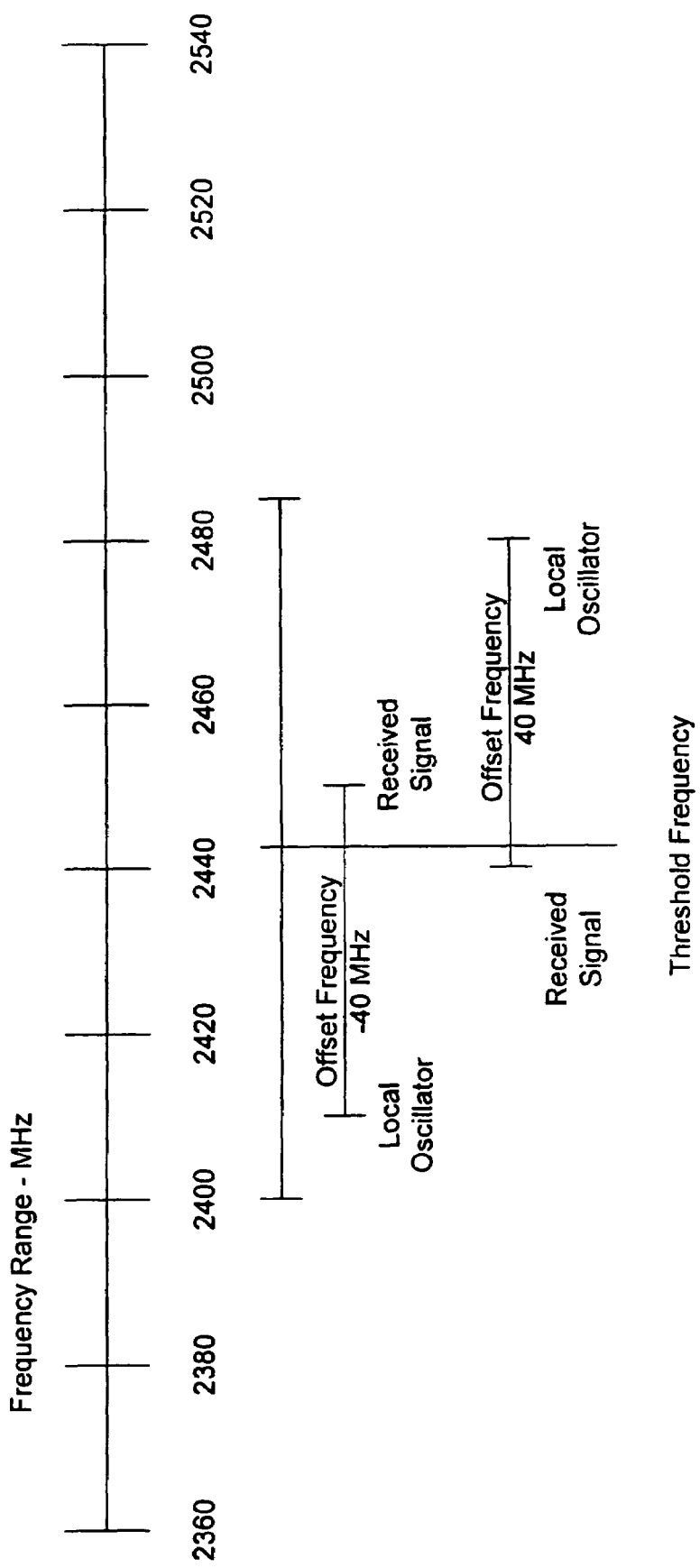
FIG. 4 is a schematic diagram illustrating the tuning of a local oscillator of the receiver of FIG. 1 within a frequency range.

Referring to FIG. 4, in operation, receiver 10 prevents excessive radiation of local oscillator 26 outside frequency band 12. For every possible reception frequency within frequency band 12, local oscillator 26 is tuned to a corresponding frequency that also lies within frequency band 12. For example, if the reception frequency of the received signal is 2450 MHz, the local oscillator will be set to a value of 2410 MHz. In that case, the reception frequency is above the threshold value. Therefore, the offset frequency is selected as −40 MHz to keep the output of local oscillator 26 within frequency band 12. Similarly, if the reception frequency of the received signal is 2440 MHz, the local oscillator will be set to a value of 2480 MHz. The reception frequency is below the threshold value. Therefore, the offset frequency is selected as 40 MHz to keep the output of local oscillator 26 within frequency band 12.

In receiver 10, the offset frequencies are selected to provide the desired intermediate frequency, e.g., 40 MHz. Thus, both offset frequencies have the same magnitude as the intermediate frequency (only the direction of the offsets is altered). Receiver 10 accommodates an intermediate frequency less than or equal to $(F_{HIGH}-F_{LOW})/2$. For example, with an intermediate frequency of 40 MHz, the range of frequencies is greater than or equal to 80 MHz. If an offset greater than $(F_{HIGH}-F_{LOW})/2$ is used, a local oscillator will be tuned to a frequency outside the bounds of $F_{HIGH}$ and $F_{LOW}$. However, other designs, which may include offsets and mixing arrangements such that an intermediate frequency that is greater than $(F_{HIGH}-F_{LOW})/2$, are possible and remain within the scope of the invention so long as the frequency of the local oscillator remains within the predetermined frequency band in which the reception frequency lies, and the offset frequency is positive while receiving signals in the bottom of the band and negative while receiving signals in the top of the band.

Other embodiments are within the scope of the claims.

The embodiments disclosed herein, including all structures, arrangements, combinations of parts, algorithms, and functions are provided as examples. It is evident that those skilled in the art may now make numerous modifications to and uses of and departures from the specific apparatus and techniques disclosed herein without departing from the inventive concepts. Consequently, the invention is to be construed as embracing each and every novel feature and novel combination of features present in or possessed by the apparatus and techniques disclosed herein and limited only by the spirit and scope of the appended claims.

What is claimed is:

1. A method of tuning an oscillator of a receiver, comprising:
    selecting the desired frequency of a desired received signal within a predetermined range of reception frequencies,
    receiving an electromagnetic signal having a frequency within the predetermined range of reception frequencies;
    comparing the desired frequency of a desired received signal to a threshold frequency within the predetermined range of reception frequencies;
    always tuning the oscillator of the receiver to a frequency within the predetermined range of reception frequencies based on the threshold frequency that is less and more than the desired frequency when the desired frequency is above and below the threshold frequency respectively.

2. The method of claim 1 wherein tuning the oscillator further comprises applying one of at least first and second frequency offsets to the received frequency that is subtracted and added when the received frequency is greater than and less than the threshold frequency respectively.

3. The method of claim 2 wherein the first and second offsets have the same magnitude.

4. The method of claim 3 wherein the range of frequencies is bounded by high and low frequencies $F_{HIGH}$ and $F_{LOW}$, respectively, the first and second offsets being less than or equal to $(F_{HIGH}-F_{LOW})/2$.

5. The method of claim 3 wherein the first and second frequency offsets are equal to an intermediate frequency of the receiver.

6. A method of tuning an oscillator of a receiver, comprising:
    selecting the desired frequency of a desired received signal within a predetermined range of reception frequencies,
    receiving an electromagnetic signal having a frequency within the predetermined range of reception frequencies;
    comparing the desired frequency of a desired received signal to a threshold frequency within the predetermined range of reception frequencies;
    always tuning the oscillator of the receiver to a frequency within the predetermined range of reception frequencies based on the threshold frequency that is less and more than the desired frequency when the received frequency is above and below the threshold frequency respectively,
    further comprising converting the desired received signal frequency to an index value of a set of index values, the set of index values corresponding to a set of channels in said predetermined range of reception frequencies.

7. A method of tuning an oscillator of a receiver, comprising:
    selecting the desired frequency of a desired received signal within a predetermined range of reception frequencies,
    receiving an electromagnetic signal having a frequency within the predetermined range of reception frequencies;

comparing the desired frequency of a desired received signal to a threshold frequency within the predetermined range of reception frequencies;

always tuning the oscillator of the receiver to a frequency within the predetermined range of reception frequencies based on the threshold frequency that is less and more than the received frequency when the desired frequency is above and below the threshold frequency respectively, further comprising representing the threshold frequency as an index value of a set of index values, the set of index values uniquely corresponding to a set of channels in said predetermined range of reception frequencies.

8. A method of tuning an oscillator of a receiver, comprising:

receiving an electromagnetic signal having a frequency within a predetermined range of reception frequencies;

comparing the frequency of a desired received signal to a threshold frequency;

tuning the oscillator of the receiver to a frequency within the range of reception frequencies based on the threshold frequency that is less and more than the desired received frequency when the desired received frequency is above and below the threshold frequency respectively, wherein the range of frequencies is bounded by high and low frequencies $F_{HIGH}$ and $F_{LOW}$ respectively, the threshold frequency approximately equalling $F_{LOW}+(F_{HIGH}-F_{LOW})/2$.

9. A method of tuning an oscillator of a receiver, comprising:

selecting the desired frequency of a desired received signal within a predetermined range of reception frequencies, receiving an electromagnetic signal having a frequency within predetermined range of reception frequencies;

comparing the desired frequency of a desired received signal to a threshold frequency within the predetermined range of reception frequencies;

always tuning the oscillator of the receiver to a frequency within the range of reception frequencies based on the threshold frequency that is less and more than the desired frequency when the desired frequency is above and below the threshold frequency, respectively, wherein the range of frequencies is 2400 MHz to 2485 MHz inclusive.

10. A receiver comprising, a signal path for conducting a received electrical signal of reception frequency within a predetermined range of frequencies;

a local oscillator, for providing a local oscillator signal;

a mixer coupled to said local oscillator and said signal path for providing an intermediate frequency signal of intermediate frequency, and a frequency controller coupled to said local oscillator and said signal path for providing a frequency control signal to said local oscillator that always sets the frequency of said local oscillator to a frequency that differs from that of a received signal within said predetermined frequency range by said intermediate frequency and is within said predetermined frequency range, wherein the frequency controller further comprises a microprocessor, wherein the microprocessor comprises a computer readable medium containing instructions capable of causing the frequency controller to:

establish a first frequency offset value from said reception frequency for the local oscillator frequency of magnitude corresponding to said intermediate frequency when the reception frequency is greater than a predetermined threshold frequency within said predetermined range; and establish a second frequency offset value from said reception frequencies for the local oscillator frequency of magnitude corresponding to said intermediate frequency when the reception frequency is less than said threshold frequency.

* * * * *